(12) United States Patent
Meissner et al.

(10) Patent No.: US 12,259,426 B2
(45) Date of Patent: Mar. 25, 2025

(54) OVER THE AIR TEST CHAMBER WITH OPTIMIZED AIR CIRCULATION

(71) Applicant: Rohde & Schwarz GmbH & Co. KG, Munich (DE)

(72) Inventors: Ralf Meissner, Gilching (DE); Markus Herbrig, Grafing b. München (DE); Stefan Schoetz, Kollnburg (DE); Constantin Sinn, Munich (DE); Christian Aichinger, St. Englmar (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 441 days.

(21) Appl. No.: 17/677,928

(22) Filed: Feb. 22, 2022

(65) Prior Publication Data
US 2023/0266383 A1     Aug. 24, 2023

(51) Int. Cl.
*G01R 31/28* (2006.01)
*G01R 29/10* (2006.01)
*G01R 31/302* (2006.01)

(52) U.S. Cl.
CPC ....... *G01R 31/2874* (2013.01); *G01R 29/105* (2013.01); *G01R 31/3025* (2013.01)

(58) Field of Classification Search
CPC ............ G01R 31/2874; G01R 31/3025; G01R 29/105; G01R 31/2879; H04B 17/0085; H04B 17/29; G01K 2217/00; G01K 17/08
See application file for complete search history.

(56) References Cited

U.S. PATENT DOCUMENTS

| | | | |
|---|---|---|---|
| 5,565,313 A | 10/1996 | Ishidai et al. | |
| 9,906,315 B1 * | 2/2018 | Bartko | H04B 17/0085 |
| 2004/0031398 A1 | 2/2004 | Jiang | |
| 2010/0125377 A1 * | 5/2010 | Kim | G05D 23/1919 |
| | | | 324/750.09 |
| 2017/0016944 A1 * | 1/2017 | Esplin | G01R 29/105 |
| 2020/0025822 A1 * | 1/2020 | Rowell | G01R 29/0821 |
| 2021/0318369 A1 * | 10/2021 | Rehammar | H01Q 15/006 |

FOREIGN PATENT DOCUMENTS

| | | |
|---|---|---|
| GB | 898 472 A | 6/1962 |
| JP | 3248036 B2 | 11/2001 |
| RU | 2 523 098 C2 | 5/2014 |
| WO | WO-2021092775 A1 * | 5/2021 |

* cited by examiner

*Primary Examiner* — David M Schindler
*Assistant Examiner* — Dilara Sultana
(74) *Attorney, Agent, or Firm* — Westman, Champlin & Koehler, P.A.

(57) ABSTRACT

An over the air, OTA, test chamber for testing at least one device under test, DUT, provided within the OTA test chamber which includes a thermal bubble component adapted to receive the device under test, DUT, comprising an air inlet adapted to supply air into the thermal bubble component, an air outlet adapted to remove air from the thermal bubble component and an airstream diffusor provided at the air inlet and adapted to diffuse an airstream supplied by the air inlet within the thermal bubble component.

20 Claims, 7 Drawing Sheets

OVER THE AIR TEST CHAMBER WITH OPTIMIZED AIR CIRCULATION

FIELD OF THE INVENTION

The invention relates to an over the air test chamber for testing at least one device under test provided within a thermal bubble component of the OTA test chamber with optimized air circulation.

TECHNICAL BACKGROUND

Electronic devices require testing under different temperature conditions. For testing whether a device under test (DUT) complies with a telecommunication standard, the device is placed in a highly shielded test chamber comprising an antenna system and reflectors. When testing the device under test under predefined thermal conditions, the device under test can be placed in an RF transparent thermal bubble component in which the device under test is heated or cooled during test cycles. The device under test can be fixed on a positioner holding the device under test during testing. To achieve three-dimensional measurements, the device under test positioner may rotate within the thermal bubble component of the test chamber. An inhomogeneous distribution of air within the thermal bubble component of the test chamber can lead to significant temperature differences within the thermal bubble component and consequently also at the device under test placed within the thermal bubble component. An inhomogeneous distribution of the air circulating within the thermal bubble component does increase the time period required to achieve certain temperature changes or temperature profiles within the thermal bubble component during testing of the device under test. The increased required test time period of the test temperature cycles reduces the measurement performance of the test setup. Accordingly, there is a need to provide an over the air (OTA) test chamber with optimized air circulation to reduce time periods required for achieving temperature changes within a thermal bubble component during testing of a device under test.

SUMMARY OF THE INVENTION

The invention provides according to a first aspect an over the air, OTA, test chamber for testing at least one device under test, DUT, provided within a thermal bubble component of the OTA test chamber,
wherein the thermal bubble component comprises
an air inlet adapted to supply air into the thermal bubble component,
an air outlet adapted to remove air from the thermal bubble component and
an airstream diffusor provided at the air inlet and adapted to diffuse an airstream supplied by the air inlet within the thermal bubble component.

In a possible embodiment of the over the air, OTA, test chamber, the thermal bubble component of the OTA test chamber comprises a device under test, DUT, positioner adapted to hold the device under test, DUT, and adapted to be rotated within the thermal bubble component during testing of the device under test, DUT.

In a further possible embodiment of the over the air, OTA, test chamber according to the first aspect of the prevent invention, the airstream diffusor is provided at the air inlet of the thermal bubble component and is arranged below the device under test positioner of the thermal bubble component.

In a further possible embodiment of the over the air, OTA, test chamber according to the first aspect of the prevent invention, the airstream diffusor is adapted to distribute the airstream supplied by the air inlet of the thermal bubble component substantially evenly within the thermal bubble component of the OTA test chamber.

In a further possible embodiment of the over the air, OTA, test chamber according to the first aspect of the prevent invention, the airstream diffusor is adapted to distribute the airstream supplied by the air inlet of the thermal bubble component to achieve turbulences within the thermal bubble component of the OTA test chamber.

In a further possible embodiment of the over the air, OTA, test chamber according to the first aspect of the prevent invention, the airstream diffusor comprises a flexible outlet hose which is pointable toward the device under test, DUT, held by the device under test positioner.

In a further possible embodiment of the over the air, OTA, test chamber according to the first aspect of the prevent invention, the airstream diffusor comprises a predefined shape adapted to optimize the air circulation within the thermal bubble component.

In a further possible embodiment of the over the air, OTA, test chamber according to the first aspect of the prevent invention, the airstream diffusor comprises an adaptable or controllable shape which can be controlled to optimize the air circulation within the thermal bubble component.

In a further possible embodiment of the over the air, OTA, test chamber according to the first aspect of the prevent invention, the thermal bubble component of the OTA test chamber comprises
a removable RF transparent dome,
a locking grip attached to the dome and
a bottom shell having a rotatable DUT positioner.

In a further possible embodiment of the over the air, OTA, test chamber according to the first aspect of the prevent invention, the test chamber further comprises a rotatable hollow cable mast which is attached to the rotatable DUT positioner and can be used to conduct cables connectable to the device under test, DUT, held by the DUT positioner of the thermal bubble component.

In a further possible embodiment of the over the air, OTA, test chamber according to the first aspect of the prevent invention, the air inlet and the air outlet of the thermal bubble component of the OTA test chamber are connectable through corresponding air hoses to a thermal test device.

In a further possible embodiment of the over the air, OTA, test chamber according to the first aspect of the prevent invention, at least one temperature sensor is provided within and/or outside the thermal bubble component of the OTA test chamber to generate a temperature signal supplied to a thermal test device for monitoring a temperature or temperature distribution within the thermal bubble component.

The invention provides according to a further second aspect a test apparatus used for testing at least one device under test, DUT, placed in a thermal bubble component of an over the air, OTA, test chamber under controlled thermal conditions,
said testing apparatus comprising an OTA test chamber which includes a thermal bubble component adapted to receive the device under test, DUT, and having
an air inlet adapted to supply air into the thermal bubble component, an air outlet adapted to remove air from the thermal bubble component and having an airstream diffusor provided at the air inlet and adapted to diffuse an airstream supplied by the air inlet within the thermal bubble component.

In a possible embodiment of the testing apparatus according to the second aspect of the present invention, the OTA test chamber further comprises a test antenna system connectable to signal measurement instruments.

In a further possible embodiment of the testing apparatus according to the second aspect of the present invention, a thermal test device is connected via air hoses to the air inlet and to the air outlet of the thermal bubble component within the OTA test chamber of the testing apparatus.

In a still further possible embodiment of the testing apparatus according to the second aspect of the present invention, the thermal test device is adapted to control test temperature cycles during testing of the device under test, DUT, placed in the thermal bubble component of the OTA test chamber of said testing apparatus.

In a possible embodiment of the testing apparatus according to the second aspect of the present invention, the device under test, DUT, placed into the thermal bubble component of the OTA test chamber of the testing apparatus comprises a mobile device, a cell phone device, a tablet or a laptop.

The invention further provides according to a third aspect a method for testing a device under test, DUT.

The invention provides according to the third aspect a method for testing a device under test, DUT, comprising the steps of:

placing the device under test, DUT, within a thermal bubble component of an OTA test chamber; and controlling an air circulation within the thermal bubble component, wherein an airstream supplied to an air inlet of the thermal bubble component is diffused to reduce time periods required for achieving temperature changes within the thermal bubble component during testing of the device under test, DUT.

In a possible embodiment of the method according to the third aspect of the present invention, the device under test, DUT, is rotated during testing to perform three-dimensional, 3D, measurements when the device under test, DUT, is heated or cooled during test temperature cycles within the thermal bubble component of the OTA test chamber during testing of the device under test, DUT.

In a still further possible embodiment of the method according to the third aspect of the present invention, the airstream supplied to the air inlet of the thermal bubble component is distributed substantially evenly within the thermal bubble component.

In a further possible embodiment of the method according to the third aspect of the present invention, the airstream supplied to the air inlet of the thermal bubble component is distributed to provide turbulences within the thermal bubble component of the OTA test chamber.

In a further possible embodiment of the method according to the third aspect of the present invention, a temperature inside and/or outside the thermal bubble component is continuously monitored.

BRIEF DESCRIPTION OF FIGURES

In the following, possible embodiments of the different aspects of the present invention are described in more detail with reference to the enclosed figures.

DETAILED DESCRIPTION OF EMBODIMENTS

Figure 1:
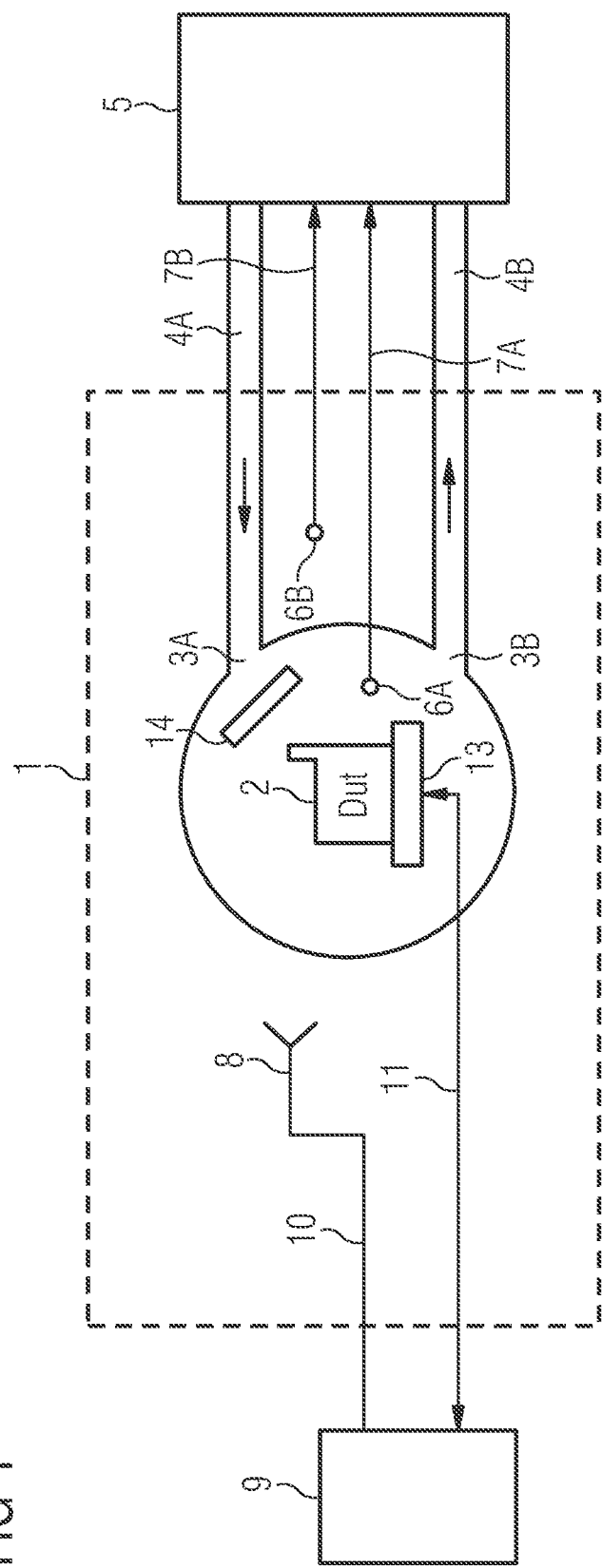
FIG. 1 is a schematic diagram for illustrating a possible test arrangement of the testing apparatus including an over the air, OTA, test chamber according to the first aspect of the present invention.

As can be seen in the schematic diagram of FIG. 1, an over the air, OTA, test chamber 1 according to the first aspect of the present invention can be used for testing at least one device under test, DUT, 2 provided within a thermal bubble component 3 of the OTA test chamber 1. The thermal bubble component 3 is adapted to receive the at least one device under test, DUT, 2 during its testing. As can be seen in FIG. 1, the thermal bubble component 3 comprises an air inlet 3A and an air outlet 3B. The air inlet 3A is adapted to supply air to the internal volume of the thermal bubble component 3.

The air outlet 3B is adapted to remove air from the inner volume of the thermal bubble component 3. The air inlet 3A and the air outlet 3B of the thermal bubble component 3 can be connected via corresponding air hoses 4A, 4B to a thermal test device 5 as illustrated in FIG. 1. Further, temperature sensors 6A inside the thermal bubble component 3 and temperature sensors 6B outside the thermal bubble component 3 can be connected through signal lines 7A, 7B to the thermal test device 5. The temperature sensors 6A, 6B generate temperature signals supplied to the thermal test device 5 for monitoring a temperature or temperature distribution within and outside the thermal bubble component 3. As illustrated in FIG. 1, the OTA test chamber 1 can comprise a test antenna system 8 connectable to signal measurement instruments 9 through signal lines 10 as illustrated in FIG. 1.

The device under test, DUT, 2 can be positioned on a DUT positioner 13 holding the device under test, DUT, 2 during testing. In a preferred embodiment, the DUT holder 13 can be rotated within the thermal bubble component 3 to provide three-dimensional measurements. Further, a rotatable hollow cable mast can be attached to the DUT positioner 13 and can be used to conduct cables 11 to provide an RF connection between the device under test, DUT, 2 held by the DUT positioner 13 and the external measurement instruments 9 as illustrated schematically in FIG. 1. The test instruments 9 can be arranged in a possible embodiment in a rack. The measurement instruments 9 can comprise in a possible embodiment an antenna positioning controller for a removable test antenna of the test antenna system 8. The measurement instruments 9 may further comprise a measuring receiver including a signal and spectrum analyzer and/or a vector network analyzer. The measurement instruments 9 can also comprise a vector signal generator used for feed-in into a passive device under test, DUT, 2. The rack may further comprise a switching unit used for automated switching between different measurement instruments provided within the rack. The airstream supplied to an air inlet 3A of the thermal bubble component 3 can be diffused by an airstream diffusor 14 to reduce time periods required for achieving temperature changes within the thermal bubble component 3 during testing of the device under test, DUT, 2. The airstream diffusor 14 is provided in a preferred embodiment at the air inlet 3A as illustrated schematically in FIG. 1.

Figure 2:
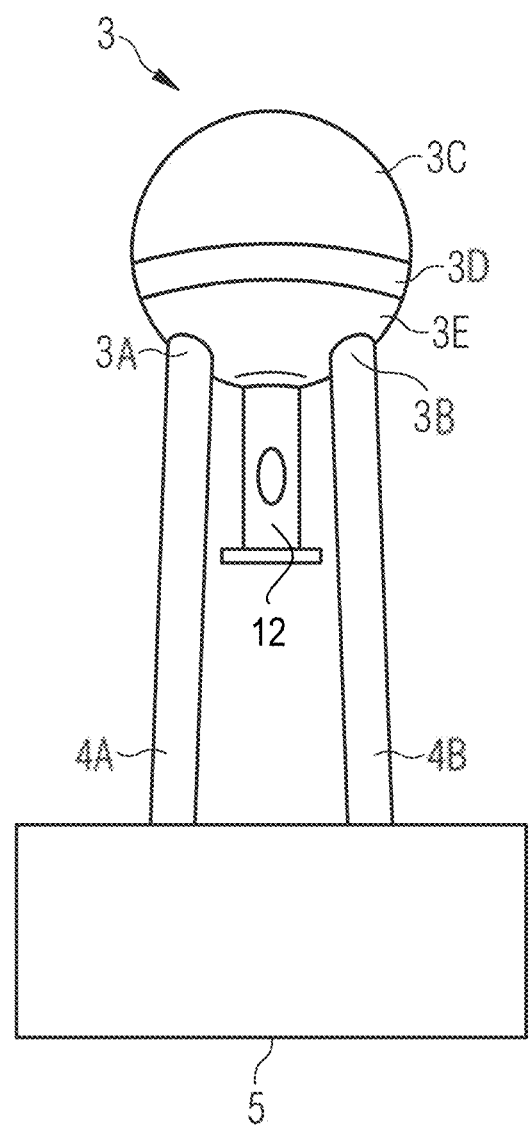
FIG. 2 illustrates a possible exemplary embodiment of a thermal bubble component included in an over the air, OTA, test chamber according to the first aspect of the present invention.

FIG. 2 illustrates schematically a possible exemplary embodiment of a thermal bubble component 3 of the OTA test chamber 1. As can be seen in FIG. 2, the thermal bubble component 3 comprises an air inlet 3A and an air outlet 3B which can be connected through air hoses 4A, 4B with the thermal test device 5. The thermal bubble component 3 is hollow and includes a device under test, DUT, positioner 13 adapted to hold the device under test, DUT, 2. The DUT positioner 13 can be rotated in a possible implementation within the thermal bubble component 3 during testing of the device under test, DUT, 2. In the illustrated embodiment of FIG. 2, the thermal bubble component 3 comprises a removable RF transparent dome 3C, a locking grip 3D and a bottom shell 3E used for housing the rotatable DUT positioner 13 which holds the device under test, DUT, 2. In the illustrated embodiment of FIG. 2, a hollow cable mast 12 is attached to the DUT positioner 13 housed by the bottom shell 3E of the thermal bubble component 3. The hollow cable mast 12 is provided to conduct cables 11 used for connection the device under test, DUT, 2 held by the DUT positioner 13 with the measurement instruments 9. In the illustrated exemplary embodiment of FIG. 2, the hollow cable mast 12 comprises holes for feeding the conductive RF cables through the hollow cable mast 12. The air hoses 4A, 4B can be connected in a possible embodiment to the air inlet 3A and air outlet 3B of the air bubble via bayonet threads.

The removable RF transparent dome 3C is made of a material with outstanding thermic stability. The locking grip 3D is attached to the dome 3C and is used for fasting the dome 3C. For loosening and removing the dome 3C, it can be rotated in one direction. The bottom shell 3E is formed by a static element and is provided for housing the rotating DUT positioner 13 holding the device under test, DUT, 2. The hollow cable mast 12 can be connected to the thermal bubble component 3 and can also rotate during the testing procedure. The DUT positioner 13 within the thermal bubble component 3 can also rotate during testing. The DUT positioner 13 can be drilled to provide different possibilities to fasten the device under test, DUT, 2 to the DUT positioner 13. Plastic screws or bolts can be used to fasten the device under test, DUT, 2 to the DUT positioner 13. The air-in hose 4A is used to supply air from the thermal test device 5 via a hose adapter into the inner space or volume of the thermal bubble component 3. The air-out hose 4B is used to remove air from the interior of the thermal air bubble 3 and can transport the removed air to the thermal test device 5.

Figure 3:
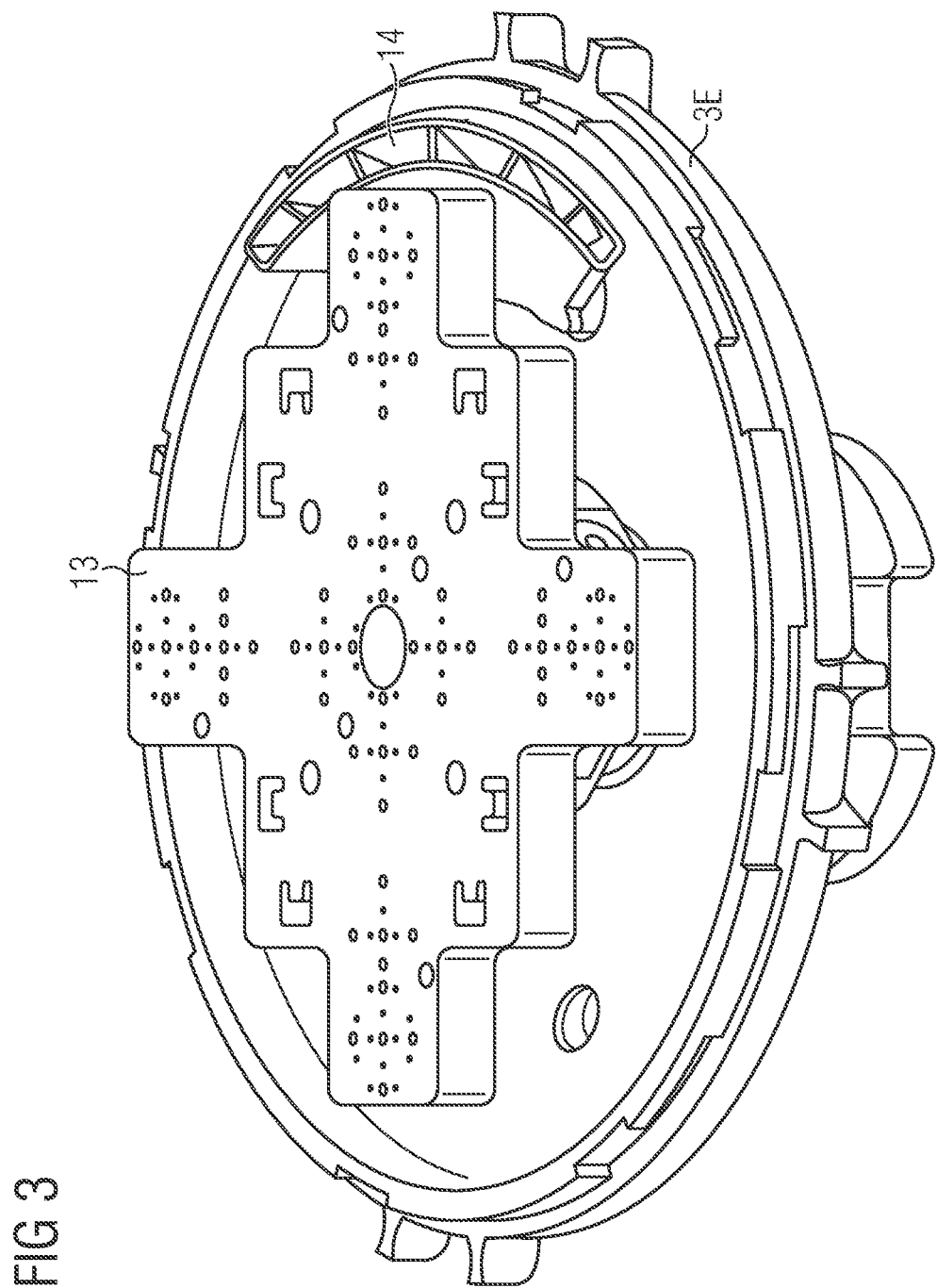
FIG. 3 illustrates a possible exemplary embodiment of an over the air, OTA, test chamber according to the first aspect of the present invention with an airstream diffusor.

FIG. 3 illustrates the device under test positioner 13 used for holding a device under test, DUT, 2 during testing. The device under test positioner 13 can be rotated within the thermal bubble component 3 to provide three-dimensional measurements. The DUT positioner 13 can rotate inside the highly shielded OTA test chamber 1. In a possible embodiment, a compact antenna test range featuring a feed antenna, at least one bidirectional parabolic reflector and a 3D DUT positioner 13 rotating within the thermal bubble component 3 is arranged within the shielded OTA test chamber 1. The parabolic reflector may comprise optimized rolled edges for superior power distribution of collimated beams after reflection. The reflector can also comprise a high precision surface to minimize errors and to enable the reflector to be used in a wide frequency range for accurate measurement results. As can be seen in FIG. 3, in the illustrated embodiment, an airstream diffusor 14 is arranged below the DUT positioner 13 of the thermal bubble component 3. The airstream diffusor 14 is provided in a preferred embodiment in the vicinity of the air inlet 3A of the thermal bubble component 3. The airstream diffusor 14 is adapted to diffuse an airstream supplied by the air inlet 3A thus influencing the air circulation within the interior space of the thermal bubble component 3. The airstream diffusor 14 has a shape which is configured to optimize the air circulation within the thermal bubble component 3. In a preferred embodiment, the airstream diffusor 14 is mounted such that it can be exchanged easily for different test scenarios. In a possible embodiment, the airstream diffusor 14 comprises a predefined shape for optimizing the air circulation within the thermal bubble component 3 for the respective test purpose. In the illustrated embodiment of FIG. 3, the airstream diffusor 14 comprises a curved parabolic shape to diffuse the input airstream.

Figure 4A:
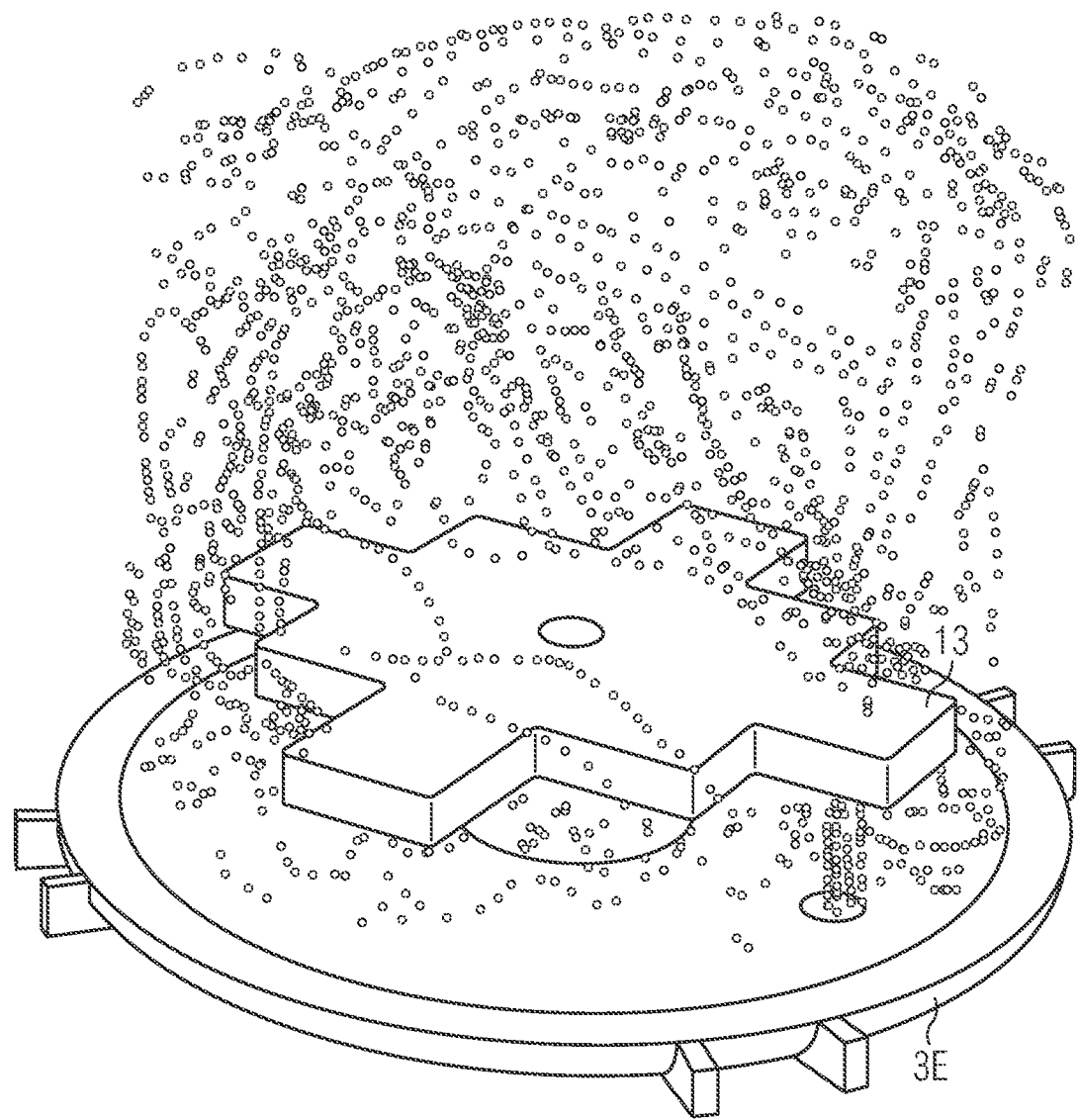
FIGS. 4A, 4B illustrate an air circulation within a thermal bubble component with or without an airstream diffusor.
Figure 4B:
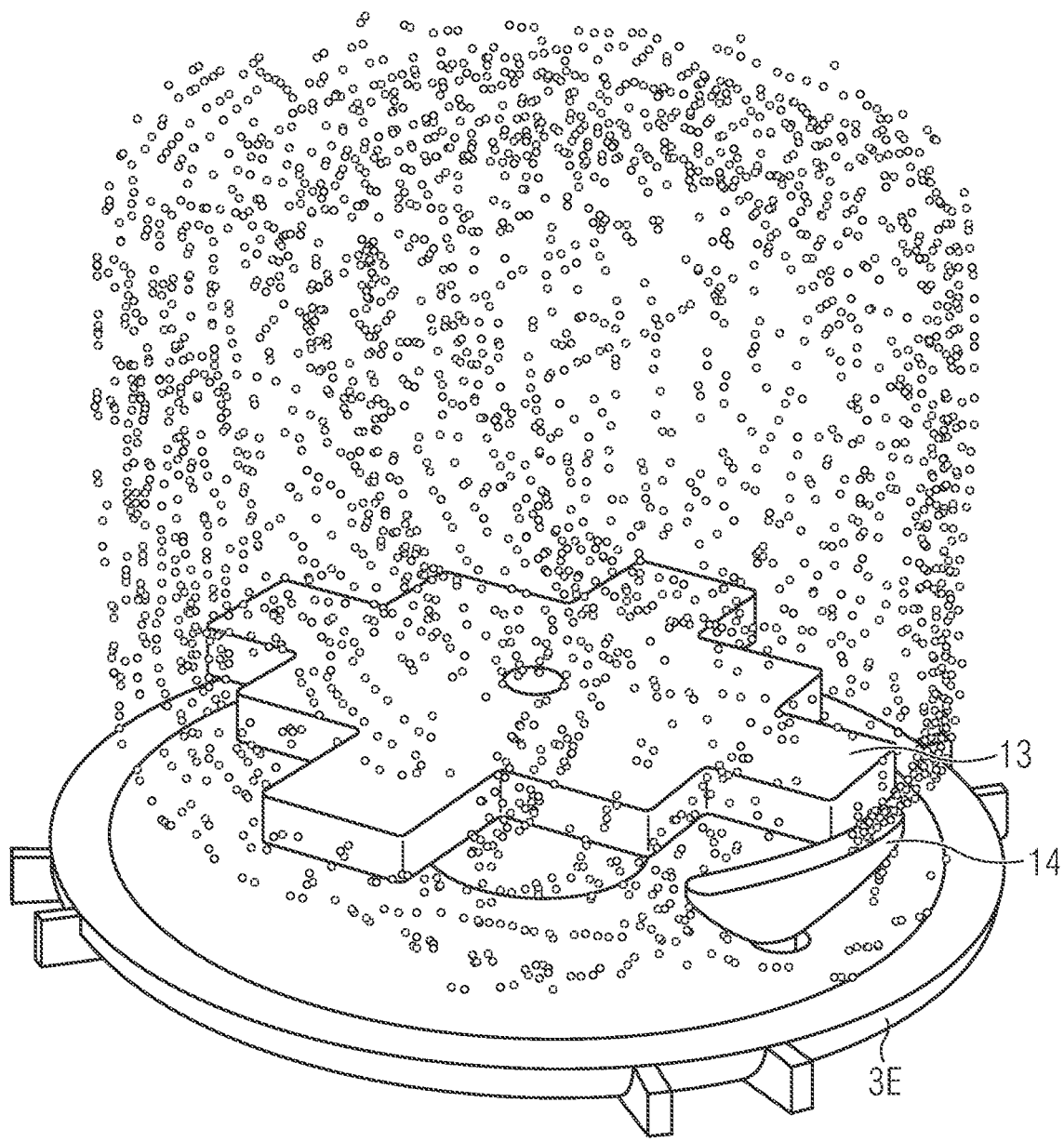

FIG. 4A illustrates the air circulating within the thermal bubble component 3 without provision of an airstream diffusor 14. In contrast, FIG. 4B illustrates the air circulation within a thermal bubble component where an airstream diffusor 14 is provided. In a conventional OTA test chamber without the provision of an airstream diffusor 14, temperature distribution at the device under test, DUT, 2 can vary depending on a rotational position of the DUT positioner 13. When an airstream diffusor 14 is lacking, only an inhomogeneous distribution of the circulating air within the thermal bubble component 3 is achieved so that there are high temperature discrepancies within the volume of the thermal bubble component 3. Accordingly, the time required to achieve a target temperature is high and results in the device under test, DUT, 2 being unevenly cooled or heated. In contrast, by provision of an airstream diffusor 14 as illustrated in FIG. 3, airstreams can be redirected and adapted such that the required target temperatures can be achieved within lower time periods thus increasing the measurement performance of the testing equipment. FIGS. 4A, 4B illustrate a simulated air circulation within the thermal bubble component with provision of an airstream diffusor 14 (FIG. 4B) and without provision of an airstream diffusor 14 (FIG. 4A).

By the provision of an airstream diffusor 14 within the thermal bubble component 3, more rapid temperature changes within the inner volume of the thermal bubble component 3 can be achieved. This results in higher Kelvin per second performance parameters indicating a reduced required time for performing temperature changes. Accordingly, the over the air, OTA, test chamber 1 according to the first aspect of the present invention comprises an integrated airstream diffusor 14 within the thermal bubble component 3 for increasing the Kelvin per second parameter and thus increasing the total measurement performance of the test setup. The provision of the airstream diffusor 14 has the advantage that the volume of the thermal bubble component 3 has not to be increased to achieve higher Kelvin per second parameter values. Accordingly, the over the air, OTA, test chamber 1 including the thermal bubble component 3 has not to be increased in size for achieving the necessary rapid temperature changes during test temperature cycles of the testing procedures.

Figure 5:
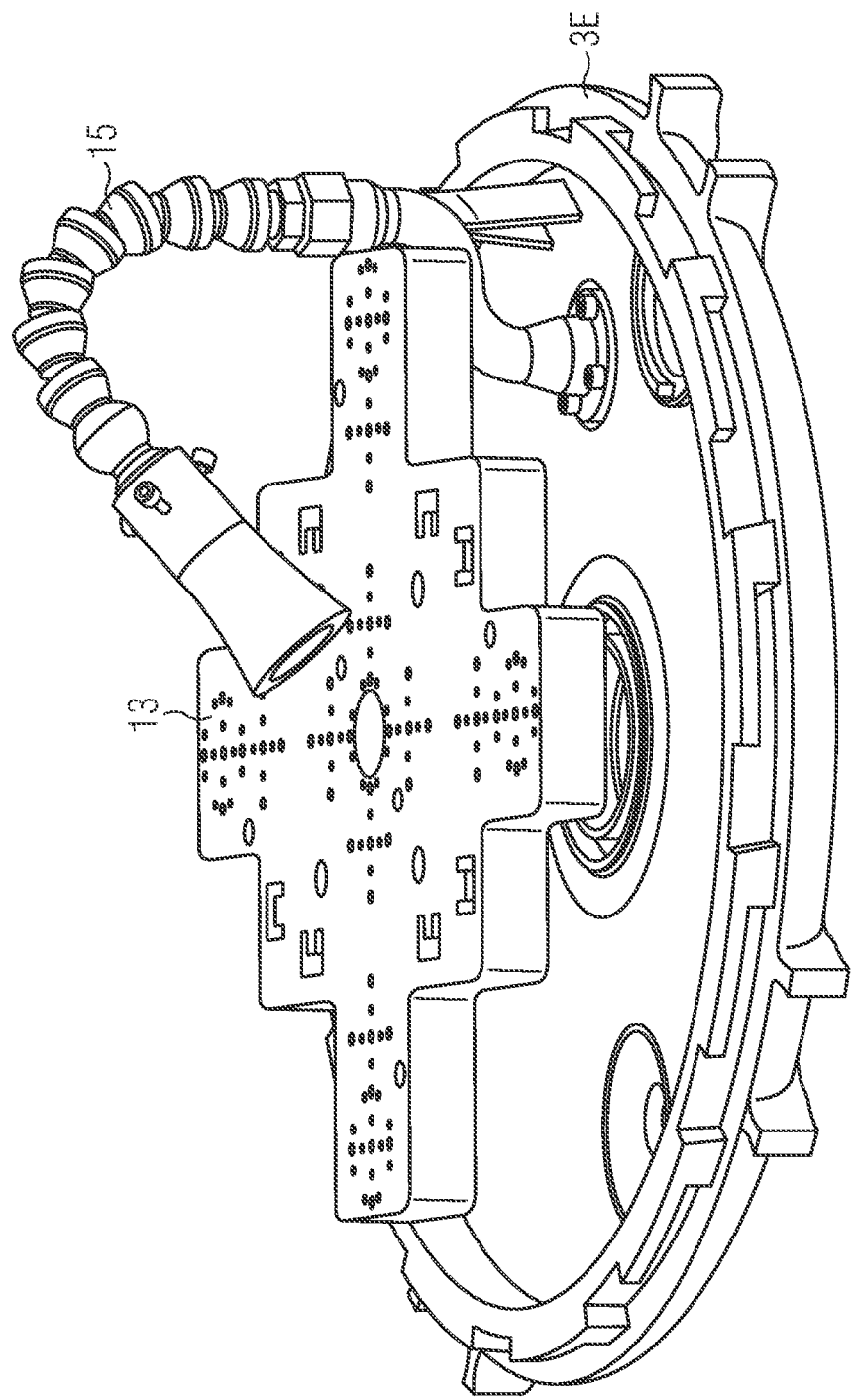
FIG. 5 illustrates a further exemplary embodiment of an over the air, OTA, test chamber according to the first aspect of the present invention with a pointable flexible outlet hose.

FIG. 5 illustrates a further exemplary embodiment of an over the air, OTA, test chamber 1 according to the first aspect of the present invention. In the illustrated embodiment of FIG. 5, the airstream diffusor 14 can comprise a flexible outlet hose 15 which can be pointed toward the device under test, DUT, 2 held by the DUT positioner 13. The flexible outlet hose 15 can comprise replaceable nozzles used for controlled heating or cooling of the device under test, DUT, 2 held by the DUT positioner 13. The flexible outlet hose 15 may be passed on the side of the DUT positioner 13 to ensure that the DUT positioner 13 can be rotated during testing. The flexible outlet hose 15 can be used either for suction of air from the interior volume of the thermal bubble component 3 or for supplying additional air into the interior volume of the thermal bubble component 3.

The flexible hose 15 illustrated in FIG. 5 can be used to provide laminar or turbulent airstreams within the interior of the thermal bubble component 3 or to provide an airstream hitting directly the surface of the device under test, DUT, 2 hold by the DUT positioner 13. With the over the air, OTA, test chamber 1 according to the first aspect of the present invention, it is possible to achieve rapid temperature changes within predefined temperature ranges, e.g., within a temperature range of −40° C. to about 85° C. In this way, it is possible to test the device under test, DUT, 2 under extreme temperature conditions and/or temperature profiles. The over the air, OTA, test chamber 1 can be used for instance to test whether the device under test, DUT, 2 complies with 3GPP standards by performing FR2 performance tests. The over the air, OTA, test chamber 1 can be used for a wide variety of different tests including EMC and field strength tests or wireless communication testing in general.

Figure 6:
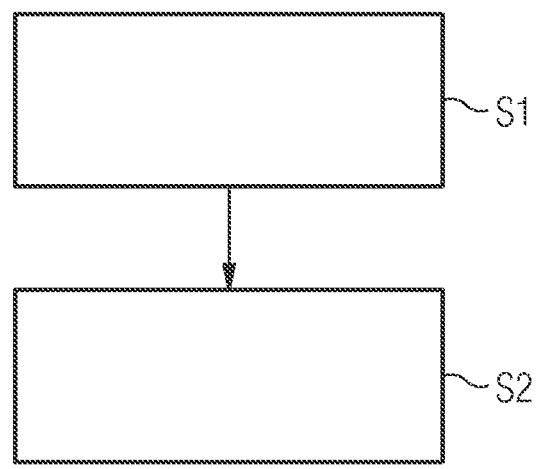
FIG. 6 shows a schematic flowchart for illustrating a possible exemplary embodiment of a testing method according to a further aspect of the present invention.

The invention further provides according to a further aspect a method for testing a device under test, DUT, 2 comprising two main steps as illustrated in FIG. 6.

In a first step S1, the device under test, DUT, 2 is placed within the thermal bubble component 3 of the OTA test chamber 1. The device under test, DUT, 2 is held by a DUT positioner 13 which can be rotated within the interior volume of the thermal bubble component 3.

In a further step S2, an air circulation within the interior volume of the thermal bubble component 3 can be controlled. The air circulation can be optimized for the respective test purpose by the airstream diffusor 14 having a suitable shape thus reducing time periods required for achieving temperature changes within the interior of the thermal bubble component 3, e.g., a time period for performing a temperature change from a first temperature to a second temperature. The temperature change can be monitored. An airstream supplied to an air inlet 3A of the thermal bubble component 3 is diffused by the airstream diffusor 14 to reduce time periods required for achieving temperature changes within the interior volume of the thermal bubble component 3 during testing of the device under test, DUT, 2. A flow rate of the supplied airstream may be additionally controlled to achieve a required temperature change within a predefined time period. The temperature changes can be monitored by a controller and can be controlled to match predefined stored temperature change profiles associated with specific test sequences.

In a preferred embodiment, the device under test positioner 13 is rotated during testing to perform three-dimensional, 3D, measurements of the device under test, DUT, 2 when at the same time the device under test, DUT, 2 is heated or cooled within the thermal bubble component 3 during its test.

The thermal test device 5 can control air circulation during the test temperature cycles when performing testing of the device under test, DUT, 2 placed in the thermal bubble component 3 of the OTA test chamber 1. The temperature inside and/or outside the thermal bubble component 3 can be monitored by the thermal test device 5 during the thermal test cycles. This can be achieved by processing the thermal measurement signals provided by the temperature sensors 6A, 6B. The thermal test device 5 can in a possible embodiment control the rotation frequency of the DUT holder within the thermal bubble component 3.

In a possible embodiment, the air circulation within the thermal bubble component 3 can be changed by replacing a first airstream diffusor 14 having a specific shape with another second airstream diffusor 14 having another specific shape. In a still further possible alternative embodiment, the air circulation within the interior volume of the thermal bubble component 3 can be optimized by changing the shape of the airstream diffusor 14 during testing procedure. In this possible implementation, the airstream diffusor 14 comprises for instance flexible portions which may be made of an inflatable or flexible material. By changing the shape of these portions, the general shape of the airstream diffusor 14 can be changed during the thermal testing cycles thus controlling and optimizing the airstreams or air circulation within the interior volume of the thermal bubble component 3 for different testing purposes.

A testing equipment including an over the air, OTA, test chamber 1 according to the first aspect of the present invention can be used to provide 5G conformance testing in a predefined frequency range. 3D measurements during thermal test cycles where the device under test, DUT, 2 is heated or cooled to extreme temperatures can be further improved by specifically designed air rotary joints with very high temperature isolation air hoses. The inside of the chamber 1 can be ventilated at all times and can be temperature-monitored. A user may set up alarm messages with observed increases in ambient temperatures. The provision of an optional infrared camera may also enable visual inspection of the chamber interior for thermal dissipation of the device under test, DUT, 2 during its testing. The over the air, OTA, test chamber 1 according to the first aspect of the present invention supports 3D radiation measurements under extreme temperature conditions to analyze temperature effects on the device under test, DUT, 2. An isolated yet RF transparent enclosure is placed on the 3D device under test positioner 13 without limiting its movement. The device under test, DUT, 2 can be placed inside the enclosure of the thermal bubble component 3 and can be heated or cooled by use of an external heat pump. The dome-shaped lid 3C is made from RF transparent material and does tightly encloses the included device under test, DUT, 2 with little to no influence on the RF radiation. The enclosure size of the thermal bubble component 3 may vary depending on the use case. In a possible embodiment, the enclosure size can also comfortably accommodate bigger devices under test, DUTs, 2 for extreme temperature testing. Temperature-isolated and temperature-resistant air hoses can run through air rotary joints for full 3D movement even when the temperature enclosure is placed on the DUT positioner 13 thus enabling testing in a wide temperature range. RF-shielded air feed-throughs in the chamber wall can connect the air hoses to the external temperature control system including the thermal testing device 5.

The shape of the airstream diffusor 14 within the thermal bubble component 3 can vary depending on the use case, i.e., depending on the type of the device under test, DUT, 2 and/or depending on the size of the thermal bubble component 3 placed within the OTA test chamber 1. The shape of the airstream diffusor 14 can be configured to meet the specific requirements of a specific thermal test cycle within a thermal testing procedure provided by the test apparatus. The shape of the airstream diffusor 14 can be either preconfigured, i.e., having a fixed geometry. In an alternative embodiment, the airstream diffusor 14 can comprise controllable mechanical elements or portions which allow to change the shape of the airstream diffusor 14 during a thermal test cycle of the testing procedure.

One skilled in the art will acknowledge that a wide variety of different possible embodiments within the scope of the claims can be provided.

In a possible implementation, an air pressure within the interior volume of the thermal bubble component 3 sealed by the locking grip 3D may be controlled as well. For high temperatures, the RF transparent dome 3C is sealed by the locking grip 3D. In a possible embodiment, the operating temperature range of the over the air, OTA, test chamber 1 is at least −60° C. to +105° C. A frost-free testing can be achieved by using dry air having a nominal humidity of less than 45%. A temperature control of the supplied air can be achieved by processing the temperature signals received from the temperature sensors 6A, 6B. In a possible implementation, a thermal calibration is performed. In this implementation, the temperature sensors 6A, 6B can be separately calibrated using an external temperature reference. The over the air, OTA, test chamber 1 according to the present invention can be used both for testing passive devices under test, DUTs, 2 and active devices under test, DUTs, 2. An active device under test, DUT, 2 comprises an internal RF transceiver which can generate and/or receive RF signals which comprise continuous wave or modulated signals. An RF cable is not part in this test setup. In contrast, a passive device under test, DUT, 2 comprises an RF cable-fed DUT where ports are connected to a VNA. The thermal test device 5 connected to the thermal bubble component 3 can supply air with a controllable flow rate. Further, the supplied air can comprise an adjustable inlet temperature. The thermal bubble component 3 can further comprise means for removing water condensing within the thermal bubble component volume.

The invention claimed is:

1. An over the air, OTA, test chamber for testing at least one device under test, DUT, provided within the OTA test chamber which includes a thermal bubble component adapted to receive the device under test, DUT, wherein the thermal bubble component comprises:
   an air inlet adapted to supply air into the thermal bubble component,
   an air outlet adapted to remove air from the thermal bubble component and
      an airstream diffusor provided at the air inlet and adapted to diffuse an airstream supplied by the air inlet within the thermal bubble component, wherein a rotatable hollow cable mast is attached to a rotatable DUT positioner housed by a bottom shell of the thermal bubble and is used to conduct cables through the hollow cable mast to provide an RF connection between the device under test, DUT, held by the DUT positioner and external measurement instruments, wherein the hollow cable mast can be rotated during a testing procedure.

2. The over the air, OTA, test chamber according to claim 1 wherein the thermal bubble component comprises the device under test, DUT, positioner adapted to hold the device under test, DUT, and adapted to be rotated within the thermal bubble component during testing of the device under test, DUT.

3. The over the air, OTA, test chamber according to claim 2 wherein the airstream diffusor is provided at the air inlet of the thermal bubble component and is arranged below the DUT positioner of the thermal bubble component.

4. The over the air, OTA, test chamber according to claim 1 wherein the airstream diffusor is adapted to distribute the airstream supplied by the air inlet of the thermal bubble component substantially evenly within the thermal bubble component of the OTA test chamber.

5. The over the air, OTA, test chamber according to claim 1 wherein the airstream diffusor is adapted to distribute the airstream supplied by the air inlet of the thermal bubble component turbulently within the thermal bubble component of the OTA test chamber.

6. The over the air, OTA, test chamber according to claim 1 wherein the airstream diffusor comprises a flexible outlet hose pointable toward the device under test, DUT, held by the DUT positioner.

7. The over the air, OTA, test chamber according to claim 1 wherein the airstream diffusor comprises a predefined shape or a controllable shape adapted to optimize an air circulation within the thermal bubble component, wherein the airstream diffusor having the controllable shape comprises controllable mechanical elements or portions which allow to change the shape of the airstream diffusor during a thermal test cycle of a testing procedure.

8. The over the air, OTA, test chamber according to claim 1 wherein the thermal bubble component comprises
   a removable RF transparent dome,
   a locking grip attached to the dome and
   the bottom shell housing the rotatable DUT positioner.

9. The over the air, OTA, test chamber according to claim 1 wherein the air inlet and the air outlet of the thermal bubble components of the OTA test chamber are connectable through corresponding air hoses to a thermal test device.

10. The over the air, OTA, test chamber according to claim 1 wherein at least one temperature sensor is provided within and/or outside the thermal bubble component to generate a temperature signal supplied to a thermal test device for monitoring a temperature within the thermal bubble component.

11. A testing apparatus used for testing at least one device under test, DUT, placed in an over the air, OTA, test chamber under controlled thermal conditions,
   said testing apparatus comprising the over the air, OTA, test chamber which includes a thermal bubble component adapted to receive the device under test, DUT, and having:
   an air inlet adapted to supply air into the thermal bubble component,
   an air outlet adapted to remove air from the thermal bubble component and
      an airstream diffusor provided at the air inlet and adapted to diffuse an airstream supplied by the air inlet within the thermal bubble component, wherein a rotatable hollow cable mast is attached to a rotatable DUT positioner housed by a bottom shell of the thermal bubble component and is used to conduct cables to provide an RF connection between the device under test, DUT, held by the DUT positioner and measurement devices of said testing apparatus, wherein the rotatable hollow cable mast can be rotated during a testing procedure performed by said testing apparatus.

12. The testing apparatus according to claim 1 comprising within the OTA test chamber a test antenna system connectable to signal measurement instruments.

13. The testing apparatus according to claim 11 comprising a thermal test device connectable via air hoses to the air inlet and to the air outlet of the thermal bubble component within the OTA test chamber of the testing apparatus.

14. The testing apparatus according to claim 13 wherein the thermal test device is adapted to control test temperature cycles during testing of the device under test, DUT, placed in the OTA test chamber of the testing apparatus.

15. The testing apparatus according to claim 11 wherein the device under test, DUT, comprises a mobile device, a cell phone, a tablet or a laptop.

16. A method for testing a device under test, DUT, comprising the steps of:

placing the device under test, DUT, within a thermal bubble component of an over the air, OTA, test chamber, wherein a rotatable hollow cable mast is attached to a rotatable DUT positioner housed by a bottom shell of the thermal bubble component and is used to conduct cables to provide an RF connection between the device under test, DUT, held by the rotatable DUT positioner and measurement instruments; and controlling an air circulation within the thermal bubble component, wherein an airstream supplied to an air inlet of the thermal bubble component is diffused to reduce time periods required for achieving temperature changes within the thermal bubble component during testing of the device under test, DUT, and wherein the rotatable hollow cable mast is rotated during a testing procedure.

17. The method according to claim 16 wherein the device under test, DUT, is rotated during testing to perform three-dimensional, 3D, measurements wherein the device under test, DUT, is heated or cooled within the thermal bubble component during testing of the device under test, DUT.

18. The method according to claim 16 wherein the airstream supplied to the air inlet of the thermal bubble component is distributed substantially evenly within the thermal bubble component.

19. The method according to claim 16 wherein the airstream supplied to the air inlet of the thermal bubble component is distributed turbulently within the thermal bubble component.

20. The method according to claim 16 wherein a temperature inside and/or outside the thermal bubble component is monitored.

* * * * *